United States Patent

Lee

[11] Patent Number: 5,981,308
[45] Date of Patent: Nov. 9, 1999

[54] METHOD FOR MANUFACTURING MINUTE SILICON MECHANICAL DEVICE

[75] Inventor: Seok-Soo Lee, Kyungsangbuk-Do, Rep. of Korea

[73] Assignee: LG Semicon Co., Ltd., Chungcheongbuk-Do, Rep. of Korea

[21] Appl. No.: 08/887,927

[22] Filed: Jul. 3, 1997

[30] Foreign Application Priority Data

Aug. 26, 1996 [KR] Rep. of Korea ............. 96-35539

[51] Int. Cl.$^6$ ................ H01L 21/00; H01L 21/76
[52] U.S. Cl. ............................. 438/52; 438/411
[58] Field of Search ........................ 438/50, 51, 52, 438/53, 411; 73/504.15, 504.16, 514.21, 514.32, 514.33, 514.36; 338/5

[56] References Cited

U.S. PATENT DOCUMENTS 4,809,552  3/1989  Johnson ........................ 338/5
5,834,333  11/1998  Seefeldt et al. ............... 438/52

*Primary Examiner*—Brian Dutton

[57] ABSTRACT

A method for manufacturing a minute silicon mechanical device, which includes the steps of forming a diffusion region by doping a predetermined portion of a silicon substrate with an impurity of high density; forming an epitaxial layer over the silicon substrate including the diffusion region and forming an oxide layer over the epitaxial layer; forming an ohmic contact layer at the lower surface of the silicon substrate; patterning the oxide layer to have a striped configuration at that portion of the oxide layer corresponding to the predetermined portion of the diffusion region, thus exposing a predetermined portion of the epitaxial layer; forming a plurality of beams having a striped configuration by etching the exposed portion of the epitaxial layer, using the oxide layer as a mask and then removing the oxide layer; and removing the diffusion region below the plurality of beams.

19 Claims, 3 Drawing Sheets

FIG.1.A (Prior Art)
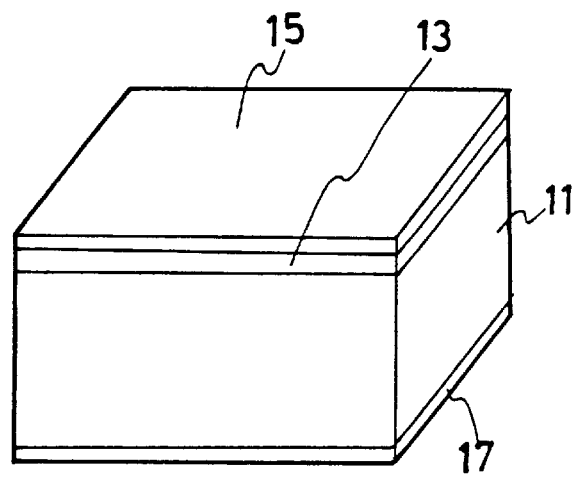
FIG.1.B (Prior Art)
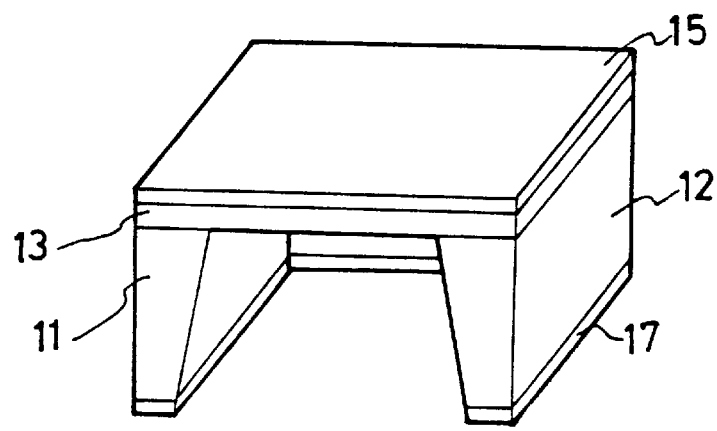
FIG.1.C (Prior Art)
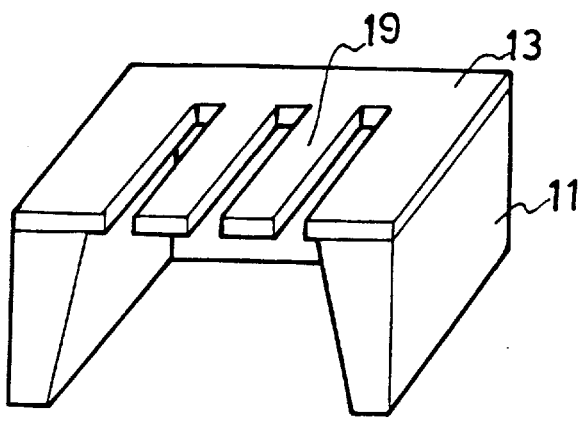

FIG.2.A
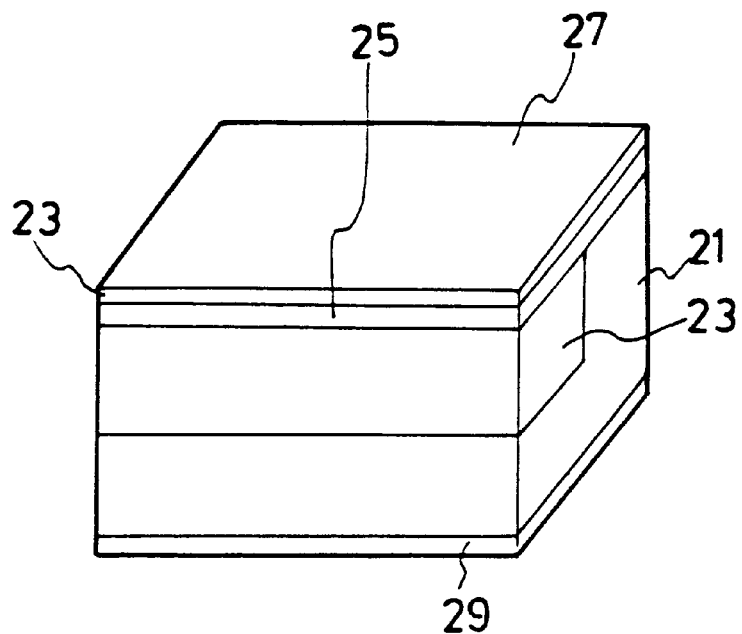
FIG.2.B
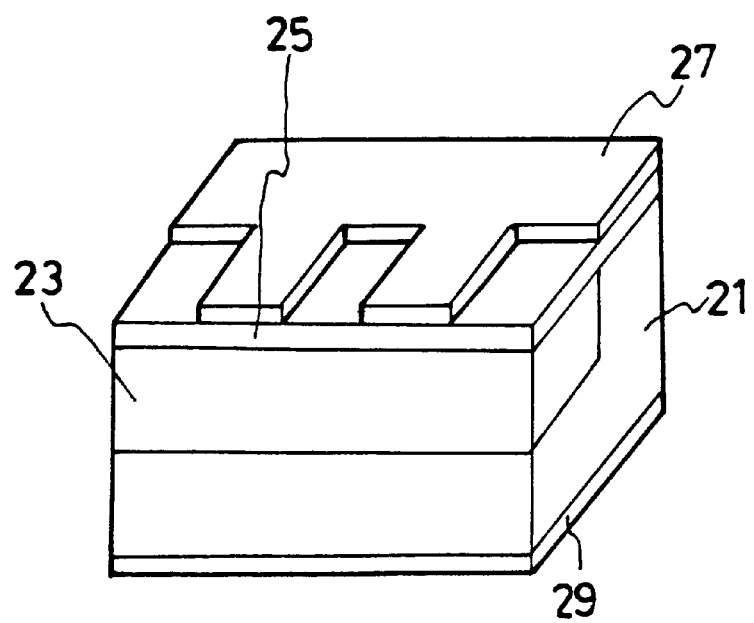

FIG.2.C
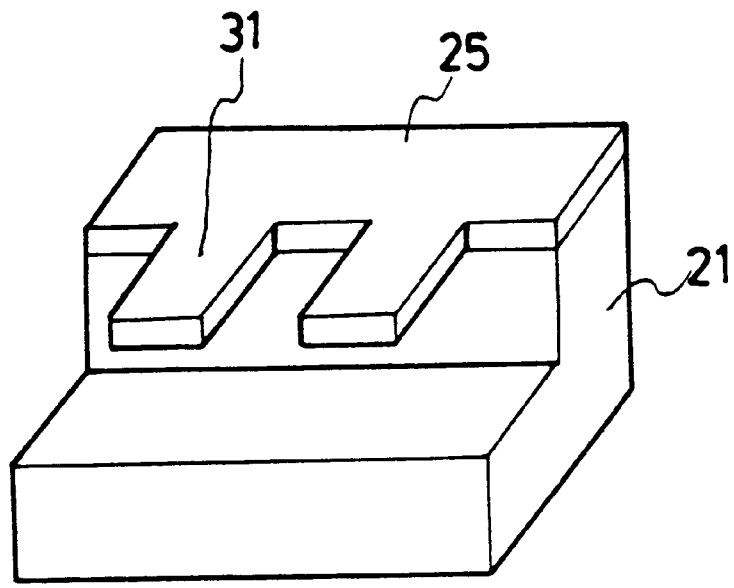
FIG.3
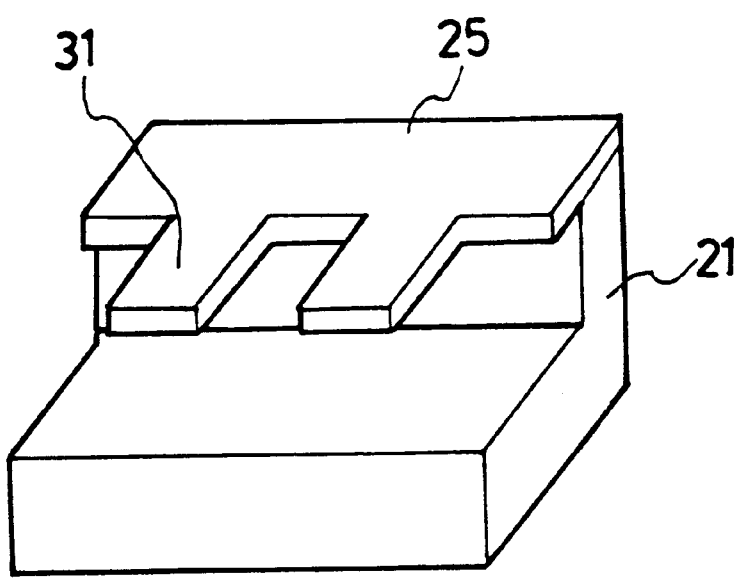

METHOD FOR MANUFACTURING MINUTE SILICON MECHANICAL DEVICE

BACKGROUND OF THE INVENTION

1. Field of the Invention

The present invention relates to a method for manufacturing a minute silicon mechanical device, and more particularly to a method for manufacturing a minute silicon minute device which removes the diffusion region doped with an impurity of high density formed over a silicon substrate via an electropolishing process and thus limits the space where beams will be bent.

2. Discussion of Related Art

Recently, development has been made on sensors which can sense oil pressure, pressure, velocity, vibration, weight and the like using silicon. These sensors utilizing the excellent mechanical characteristics of silicon and the semiconductor manufacturing technology, permit the miniaturization, weight reduction and low price of the device. In addition, the peripheral circuits for signal processing of the sensors can be integrated on an identical chip and this enables enhanced reliability, sensitivity, signal to noise characteristics, and easy application to the system.

The sensor using silicon consists of a minute mechanical structure to which physical power, such as oil pressure, pressure, velocity, vibration, and weight is applied, a converting element for converting the physical power to an electric signal and a signal processor for producing a rated output.

The minute mechanical structure as a core part of the silicon sensor is manufactured using minute silicon processing technology and has a diaphragm, a cantilever, and an air-bridge.

FIGS. 1(A) to 1(C) illustrate the sequential steps of the manufacturing process of the minute silicon mechanical device according to the prior art.

Referring to FIG. 1(A), an N-type epitaxial layer 13 is formed over a P-type silicon substrate 11. The upper portion of the epitaxial layer 13 is thermal-oxidized to form an upper oxide layer 15 and the lower surface of the silicon substrate 11 is ground to a predetermined thickness via a back-grinding method. Thereafter, the lower surface of the silicon substrate 11 is thermal-oxidized to form a lower oxide layer 17.

Referring to FIG. 1(B), the edge portion including one of four edges of the lower oxide layer 17 and the center portion thereof are removed via a photolithography process, thus exposing the lower surface of the silicon substrate 11. In this case, the lower oxide layer 17 has the form of a small letter "n." By applying a backward electric field between the P-type silicon substrate 11 and the N-type epitaxial layer 13, the exposed lower surface of the silicon substrate 11 is etched with an anisotropic etchant, such as KOH, EPW (Ethylenediamine Pyrocatechol Water), Hydrazine or the like. In this case, the lower oxide layer 17 serves as an etch mask, and thus the silicon substrate 11 is etched to define three side walls 12. The silicon substrate 11 is anisotropically etched by this etchant. A depletion layer is formed at the boundary surface between the silicon substrate 11 and the epitaxial layer 13 by the backward voltage applied therebetween, thus preventing the epitaxial layer 13 from being etched. Hence, the epitaxial layer 13 becomes an etch stop layer and only the silicon substrate 11 is selectively etched. The silicon substrate 11 is normally etched at a temperature ranged from 60° C. to 120° C., however, the higher the temperature, the faster the etching speed.

Referring to FIG. 1(C), the upper oxide layer 15 is patterned via a photolithography process to be of the type that one end is connected and the other end, which does not face toward any of the three side walls 12 of the silicon substrate 11, is in stripe form. Then, the epitaxial layer 13 is patterned by using the upper oxide layer 15 as a mask, thus forming a plurality of beams 19 having a cantilever configuration. Thereafter, the upper and lower oxide layers 15 and 17 are removed.

In the minute silicon mechanical device manufactured as described above, the beams thereof are bent by physical power, such as external oil pressure, pressure, velocity, vibration, and weight, thus generating stress. This generated stress is converted into an electric signal at a converting element, thus sensing the strength of the power applied to the beams.

However, the manufacturing method of the minute silicon mechanical device as described above has some problems in that the silicon substrate is contaminated by the silicon particles generated while graining the lower surface of the silicon substrate and that the etching time is increased due to the anisotropic etching of the silicon substrate. Another problem is that the upper and lower portions of the epitaxial layer must be aligned to form the beams at the portion where the side walls are not formed, and this alignment is very difficult and may cause errors.

SUMMARY OF THE INVENTION

Accordingly, the present invention is directed to a method for manufacturing a minute silicon mechanical device that substantially obviates one or more of the problems due to limitations and disadvantages of the related art.

Thus, an object of the present invention is to provide a method for manufacturing a minute silicon mechanical device which limits the space where beams will be bent via an electropolishing process, thus enabling a shorter etching time and preventing the silicon substrate from becoming contaminated.

Another object of the present invention is to provide a method for manufacturing a minute silicon mechanical device which forms beams and removes the active region without a mask, thus avoiding the generation of alignment error.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

To achieve these and other advantages in accordance with the present invention, as embodied and broadly described, a method for manufacturing a minute silicon mechanical device of the present invention includes the steps of forming a diffusion region doped with impurity of high density over a predetermined portion of a silicon substrate; forming an epitaxial layer over the silicon substrate including the diffusion region and forming an oxide layer over the epitaxial layer; forming an ohmic contact layer at the lower surface of the silicon substrate; patterning the oxide layer to be a stripe form at the portion corresponding to a predetermined portion of the diffusion region and thus exposing a predetermined portion of the epitaxial layer; forming a plurality of beams of striped configuration by etching the exposed portion of the epitaxial layer using the oxide layer as a mask and then removing the oxide layer; and removing the diffusion region below the beams.

It is to be understood that both the foregoing general description and the following detailed description are exemplary and explanatory and are intended to provide further explanation of the invention as claimed.

BRIEF DESCRIPTION OF THE ATTACHED DRAWINGS

The present invention will become more fully understood from the detailed description given hereinbelow and the accompanying drawings which are given by way of illustration only, and thus, are not limitative of the present invention, and wherein:

FIGS. 1(A) to 1(C) are diagrams sequentially showing the manufacturing process of a minute silicon mechanical device according to the prior art;

FIGS. 2(A) to 2(C) are diagrams sequentially showing the manufacturing process of a minute silicon mechanical device according to one embodiment of the present invention; and FIG. 3 is a perspective view showing a minute silicon mechanical device according to the manufacturing method of another embodiment of the present invention.

DETAILED DESCRIPTION OF PREFERRED EMBODIMENT

Reference will now be made in detail to the preferred embodiments of the present invention, examples of which are illustrated in the accompanying drawings, wherein FIGS. 2(A) to 2(C) illustrate the sequential steps of the manufacturing process of a minute silicon mechanical device according to one embodiment of the present invention.

Referring to FIG. 2(A), an N-type impurity of high density of over $10^{18}/cm^3$, e.g. phosphorus is doped to a thickness of 10 $\mu$m~15 $\mu$m over a predetermined portion of the top of an N-type silicon substrate 21 which has a crystal surface of 100 and a resistance rate of 2 $\Omega$.cm, thus forming a diffusion region 23. An N-type epitaxial layer 25, e.g. a silicon layer, which has a resistance rate of 10 $\Omega$.cm is formed to have a thickness of 3 $\mu$m~5 $\mu$m over the silicon substrate 21 including the diffusion region 23 and a silicon oxide layer 27, e.g. a silicon dioxide layer, of 2000 Å~3000 Å is formed over the top surface of the epitaxial layer 25 via thermal oxidation. Thereafter, an ohmic contact layer 29 is formed at the lower surface of the silicon substrate 21 to uniformly spread the current at the positive reaction, that is, the current can be uniformly positioned during the anodic reaction by means of the ohmic contact layer 29. The ohmic contact layer 29 is formed by diffusing the N-type impurity into the silicon substrate at a temperature of 1000° C.~1100° C. for 15~25 minutes or by depositing a conductive metal, e.g. aluminum on the silicon substrate. It should be noted that it is also possible to form a P-type diffusion region 23 and a P-type epitaxial layer 25 over the N-type silicon substrate 21.

Referring to FIG. 2(B), a photoresist layer (not shown) is doped over the oxide layer 27 and then is exposed and developed to form a striped portion in the area corresponding to the diffusion region 23. The exposed portion of the oxide layer 27 is removed via wet etching using the photoresist layer as a mask, thus exposing the epitaxial layer 25. In this case, the oxide layer 27 corresponding to that portion where the diffusion region 23 is not formed is not removed but is embodied with the striped portions. Thereafter, the photoresist layer is removed.

Referring to FIG. 2(C), using the oxide layer 27 as a mask, the exposed portion of the epitaxial layer 25 is removed by an isotropic etchant, such as KOH, or by an anisotropic etchant which combines $HNO_3$ and HF at an $HNO_3$ to HF ratio of 98:2, thus forming a plurality of beams 31 having a striped configuration. Thereafter, the oxide layer 27 remaining on the epitaxial layer 25 is removed and the diffusion region 23 is selectively removed by an electropolishing process, thus limiting the space where the beams 31 will be bent to be transformed. Thus, the diffusion region is selectively removed by an electropolishing process. The space in which the beams 31 can be bent is limited by the height of the diffusion region. That is, the beams are bent at most as high as the diffusion region. Then, the ohmic contact layer 29 is etched and removed. The electropolishing process is performed by applying an electric field between the N-type diffusion region 23 and ohmic contact layer 29 in an HF water solution of 3~5 wt % under a current density of 50~300 mA/cm$^2$. In this case, since the diffusion region 23 was doped with an impurity of high density, the size of the depletion region at the interface of the HF water solution is decreased, thus enabling the formation of the high electric field regardless of the low voltage application. Hence, an electron-hole pair is generated at the depletion region by Zener breakdown, and the diffusion region 23 is selectively and positively reacted by this generated hole and then removed. In the meanwhile, since the portion of the silicon substrate 21 where the diffusion region 23 is not formed and the epitaxial layer 25 were doped with the N-type impurity of low density, the height of the surface barrier becomes high due to the applied voltage and there is almost no hole. Thus, the hole required in a positive reaction is not supplied, resulting in no positive reaction and no etching. Therefore, it is possible to selectively remove the diffusion region 23 from that portion of the silicon substrate 21 where the diffusion region 23 is not formed and the epitaxial layer 25.

FIG. 3 is a perspective view showing a minute silicon mechanical device manufactured by the method according to another embodiment of the present invention.

The manufacturing method of the minute silicon mechanical device according to this embodiment of the present invention is identical to that according to FIGS. 2A–2C, with the exception that the active region 23 is formed over the whole surface of the silicon substrate 21. That is, in FIG. 3, in order to limit the space where the beams 31 will be bent to be transformed, the active region 23 is removed via the electropolishing process with adjusting time. Since the active region 23 is formed over the whole surface of the silicon substrate 21 and thus is not selectively removed, the active region 23 is removed with adjusting time. Thereby, the epitaxial layer 25 having a plurality of beams 31 is prevented from being separated from the body including the silicon substrate 21.

As described above, in the manufacturing method of the minute silicon mechanical device according to the present invention, the impurity of high density is doped over a predetermined portion of the silicon substrate to form the diffusion region. After formation of the epitaxial layer over the silicon substrate including the diffusion region, the epitaxial layer is patterned by using the oxide layer as a mask which has the configuration of a plurality of stripes at the portion corresponding to the diffusion region, to form a plurality of beams of stripe shape which are embodied with that portion which corresponds to the portion of the silicon substrate where the diffusion region is not formed. Then, the diffusion region is selectively removed via the electropolishing process, thus limiting the space where the beams will be bent to be transformed.

Accordingly, the present invention can prevent the contamination of the silicon substrate since the lower surface of the silicon substrate is not ground and can remove the diffusion region in a shorter time via the electropolishing process. Another advantage is that only the top of the epitaxial layer is mask-aligned to form the beams, and the diffusion region is removed without a mask, thus eliminating the generation of alignment error.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a minute silicon mechanical device, comprising the steps of:

forming a diffusion region by doping a portion of a silicon substrate with an impurity;

forming an epitaxial layer over said silicon substrate including said diffusion region and forming an oxide layer over said epitaxial layer;

forming an ohmic contact layer at the lower surface of said silicon substrate;

patterning said oxide layer to have a striped configuration at that portion of the oxide layer corresponding to the portion of said diffusion region, thus exposing a portion of said epitaxial layer;

forming a plurality of beams having a striped configuration by etching the exposed portion of said epitaxial layer, using said oxide layer as a mask and then removing said oxide layer; and removing the diffusion region below said plurality of beams.

2. The method as claimed in claim 1, wherein said silicon substrate is an N type.

3. The method as claimed in claim 1, wherein said diffusion region and said epitaxial layer are N types.

4. The method as claimed in claim 1, wherein said diffusion region and said epitaxial layer are P types.

5. The method as claimed in claim 1, wherein the high density impurity is of the N type having a density of over $10^{18}/cm^3$.

6. The method as claimed in claim 1, wherein said diffusion region is formed over the entire surface of said silicon substrate.

7. The method as claimed in claim 5, wherein said diffusion region has a thickness of 10 $\mu$m~15 $\mu$m.

8. The method as claimed in claim 1, wherein said epitaxial layer has a thickness of 3 $\mu$m~5 $\mu$m.

9. The method as claimed in claim 1, wherein said oxide layer has a thickness of 2000 Å~3000 Å which is formed by thermal oxidation.

10. The method as claimed in claim 1, wherein said ohmic contact layer is formed by doping an N-type impurity into the silicon substrate or by depositing a conductive metal on the silicon substrate.

11. The method as claimed in claim 1, wherein the exposed portion of said epitaxial layer is removed by an isotropic etchant of KOH or by an anisotropic etchant which combines $HNO_3$ and HF at a $HNO_3$ to HF ratio of 98:2.

12. The method as claimed in claim 1, wherein said diffusion region is selectively removed via an electropolishing process.

13. The method as claimed in claim 1, wherein said diffusion region is removed via an electropolishing process with adjusting time.

14. The method as claimed in claim 12, wherein said electropolishing process is performed by applying an electric field between said diffusion region and said ohmic contact layer in an HF water solution.

15. The method as claimed in claim 14, wherein said electropolishing process is performed in an HF water solution of 3~5 wt % under a current density of 50~300 mA/cm².

16. The method as claimed in claim 1, further comprising the step of removing said ohmic contact layer.

17. The method of claim 16, wherein the entire diffusion region is removed.

18. The method as claimed in claim 6, wherein said diffusion region has a thickness of 10 $\mu$m~15 $\mu$m.

19. The method as claimed in claim 13, wherein said electropolishing process is performed by applying an electric field between said diffusion region and said ohmic contact layer in an HF water solution.

* * * * *